United States Patent
Pawliuk et al.

(10) Patent No.: US 9,407,304 B1
(45) Date of Patent: Aug. 2, 2016

(54) INDUCTOR BASED SWITCHING MIXER CIRCUIT

(71) Applicant: BLACKBERRY LIMITED, Waterloo (CA)

(72) Inventors: Peter Cornelius Pawliuk, Waterloo (CA); Nan Sen Lin, Richmond Hill (CA)

(73) Assignee: BLACKBERRY LIMITED, Waterloo, Ontario (CA)

(*) Notice: Subject to any disclaimer, the term of this patent is extended or adjusted under 35 U.S.C. 154(b) by 0 days.

(21) Appl. No.: 14/693,440

(22) Filed: Apr. 22, 2015

(51) Int. Cl.
  H04B 1/16  (2006.01)
  H04B 1/10  (2006.01)
  H04B 1/26  (2006.01)
  H04B 1/12  (2006.01)

(52) U.S. Cl.
  CPC .............. *H04B 1/123* (2013.01); *H04B 1/1027* (2013.01); *H04B 2001/1072* (2013.01)

(58) Field of Classification Search
  USPC .................................. 455/323, 324, 325, 326
  See application file for complete search history.

(56) References Cited

U.S. PATENT DOCUMENTS

| | | | |
|---|---|---|---|
| 9,071,196 B2* | 6/2015 | Huang | H03D 7/1441 |
| 2004/0183630 A1 | 9/2004 | Tanne et al. | |
| 2008/0014896 A1* | 1/2008 | Zhuo | H03D 7/166 |
| | | | 455/326 |
| 2011/0065412 A1* | 3/2011 | Beffa | H03D 7/18 |
| | | | 455/326 |
| 2011/0105072 A1 | 5/2011 | Bhagat et al. | |
| 2012/0033769 A1* | 2/2012 | He | H04B 1/18 |
| | | | 375/350 |
| 2013/0028356 A1 | 1/2013 | Heck et al. | |

FOREIGN PATENT DOCUMENTS

WO  0227865 A1  4/2002

OTHER PUBLICATIONS http://www.wispry.com/products.php—Accessed Mar. 5, 2015.
http://www.quicklogic.com/assets/pdf/solution-platform-briefs/QL-Tunable-Antenna-SOLUTION-BRIEF.pdf—Accessed Mar. 5, 2015.
http://www.psemi.com/newsroom/press-releases/637686-peregrine-semiconductor-s-newest-digitally-tunable-capacitors-tune-lte-smartphone-designs—Dated Feb. 25, 2013.

* cited by examiner

*Primary Examiner* — Blane J Jackson
(74) *Attorney, Agent, or Firm* — Perry + Currier, Inc.

(57) ABSTRACT

A switching mixer that includes an input configured to receive a radio frequency (RF) signal, a set of inductors, and a set switches in a one-to-one relationship with the set of inductors. The set of switches are configured to alternate turning off in a quadrature sequence of a switching cycle. When a respective switch of the set of switches is turned off: the respective switch connects the input to a respective inductor of the set of inductors to convert the RF signal to a baseband current; and each remaining inductor of the set of inductors is configured to maintain current therein.

18 Claims, 9 Drawing Sheets

INDUCTOR BASED SWITCHING MIXER CIRCUIT

FIELD

The present specification relates generally to a radio frequency (RF) switching mixer, and specifically to an inductor based RF switching mixer.

BACKGROUND

In wireless radio frequency (RF) applications, a wireless RF receiver is subject to blocking signals. All signals that are presented to an RF receiver aside from a downlink communication RF signal are considered blocking signals. These blocking signals may be due to communications on other channels or by other services. Blocking signals can cause non-linear distortion and voltage saturation in the RF receiver, which can inhibit the RF receiver from detecting a downlink communication RF signal. Known RF receivers employ filters at the front-end to reject blocking signals. However, these filters limit the bandwidth of the RF receiver. In many applications, multiple filters and multiple receivers must be deployed to handle this limitation, which increases the complexity and cost of the receiver.

BRIEF DESCRIPTIONS OF THE DRAWINGS

For a better understanding of the various implementations described herein and to show more clearly how they may be carried into effect, reference will now be made, by way of example only, to the accompanying drawings in which.

DETAILED DESCRIPTION

Figure 1:
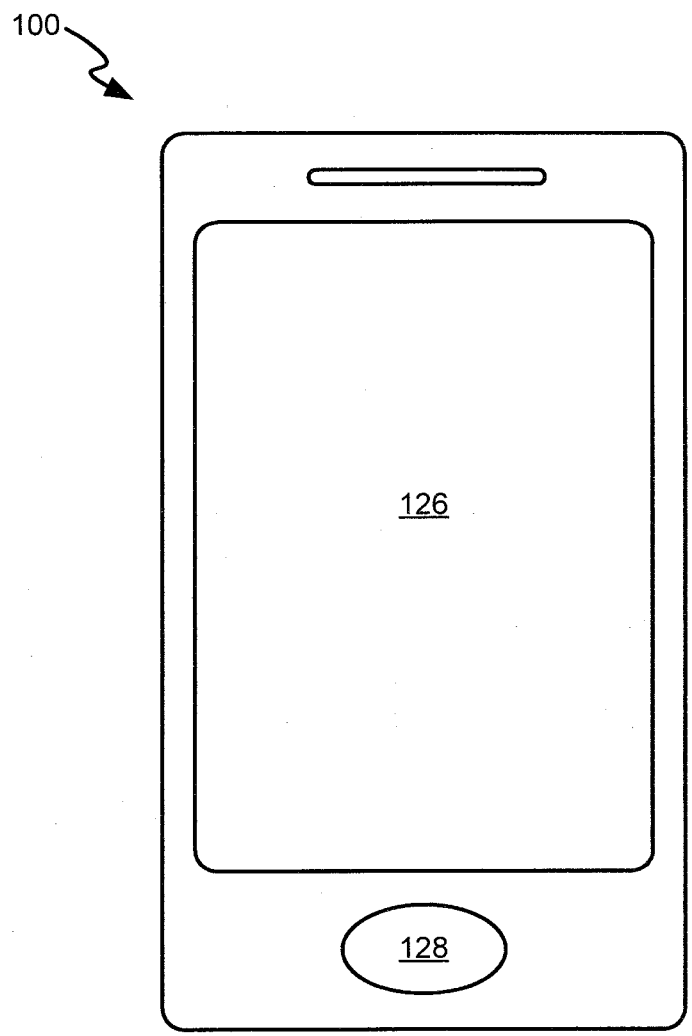
FIG. 1 is a front perspective view of a mobile electronic device in accordance with an example implementation of the present specification.

In general, the present specification is directed to an inductor based switching mixer. The inductor based switching mixer may be implemented in, for example, an RF receiver. The RF receiver may be implemented in, for example, a mobile electronic device. The inductor based switching mixer receives a RF signal and down converts the RF signal to a baseband current signal. The inductor based switching mixer is a passive mixer that uses inductors to provide continuity of a baseband current signal for transimpedance amplifiers. The switching mixer of the present specification provides a tunable filtering effect where the input has a low in-band impedance and a high out-of-band impedance. The low in-band impedance causes large currents to form in the inductors, whereas, the high out-of-band impedance inhibits blocker signals from forming large currents in the inductors. The switching mixer of the present specification operates in current mode and achieves high linearity by inhibiting voltage saturation.

In this specification, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

It is understood that for the purpose of this specification, language of "at least one of X, Y, and Z" and "one or more of X, Y and Z" can be construed as X only, Y only, Z only, or any combination of two or more items X, Y, and Z (e.g., XYZ, XY, YZ, ZZ, and the like). Similar logic can be applied for two or more items in any occurrence of "at least one . . . " and "one or more . . . " language.

It is also understood that for the purpose of this specification, language of "switch" means any device that is placed between two elements and provides either an open (no connection) or a closed (full connection) between the two elements.

For simplicity and clarity of illustration, reference numerals may be repeated among the figures to indicate corresponding or analogous elements. Numerous details are set forth to provide an understanding of the implementations described herein. The implementations may be practiced without these details. In other instances, well-known methods, procedures, and components have not been described in detail to avoid obscuring the implementations described. The specification is not to be considered as limited to the scope of the implementations described herein.

An aspect of the present specification provides a switching mixer comprising: an input configured to receive a radio frequency (RF) signal; a set of inductors; and a set switches in a one-to-one relationship with the set of inductors. The set of switches are configured to alternate turning off in a quadrature sequence of a switching cycle. When a respective switch of the set of switches is turned off: the respective switch connects the input to a respective inductor of the set of inductors to convert the RF signal to a baseband current; and each remaining inductor of the set of inductors is configured to maintain current therein.

According to another aspect of the present specification, when the respective switch of the set of switches is turned on: the respective switch shorts out the respective inductor, to maintain the current in the respective inductor.

According to another aspect of the present specification, each respective inductor of the set of inductors is connected in series and each respective switch is connected in parallel with the respective inductor in the set of inductors.

According to another aspect of the present specification, the switching mixer further comprises: a set of transimpedance amplifiers in a one-to-one relationship with the set of inductors, each transimpedance amplifier in the set of transimpedance amplifiers being configured to convert the baseband current to a baseband voltage.

According to another aspect of the present specification, each respective inductor in the set of inductors is connected in parallel with the input.

According to another aspect of the present specification, the switching mixer further comprises: a second set of switches configured to alternate turning on in the quadrature sequence of the switching cycle; and a set of transimpedance amplifiers in a one-to-one relationship with the set of inductors, each transimpedance amplifier in the set of transimpedance amplifiers being configured to convert the baseband current to a baseband voltage.

According to another aspect of the present specification, when a respective switch of the second set of switches is turned off: the respective switch isolates the respective inductor, the respective switch and the respective transimpedance amplifier from the input.

According to another aspect of the present specification, the switching mixer further comprises: a gate driver circuit configured to receive a clock signal from a local oscillator and generate the quadrature sequence of the switching cycle from the clock signal.

According to another aspect of the present specification, the switching mixer further comprises: a capacitor switching mixer coupled to the input and configured to provide a low-impedance path to ground for RF signals outside a tuned frequency of the switching mixer.

Another aspect of the present specification provides a switching mixer, comprising: an input configured to receive a radio frequency (RF) signal; a first switch configured to receive a control signal having a switching cycle and to turn off to connect the input to a first inductor to generate a first baseband current from the RF signal and turn on to maintain the first baseband current in the first inductor based on the switching cycle; a second switch configured to receive the control signal and to turn off to connect the input to a second inductor to generate a second baseband current from the RF signal and turn on to maintain the second baseband current in the second inductor based on the switching cycle; a third switch configured to receive the control signal and to turn off to connect the input to a third inductor to generate a third baseband current from the RF signal and turn on to maintain the third baseband current in the third inductor based on the switching cycle; and a fourth switch configured to receive the control signal and to turn off to connect the input to a fourth inductor to generate a fourth baseband current from the RF signal and turn on to maintain the fourth baseband current in the fourth inductor based on the switching cycle.

According to another aspect of the present specification, the switching cycle comprises four non-overlapping portions.

According to another aspect of the present specification, the first switch is configured to turn off during a first portion of the four non-overlapping portions to connect the input to the first inductor to generate the first baseband current from the RF signal and turn on during a second portion of the four non-overlapping portions, during a third portion of the four non-overlapping portions, and during a fourth portion of the four non-overlapping portions to maintain the first baseband current in the first inductor; the second switch is configured to turn off during the second portion of the four non-overlapping portions to connect the input to the second inductor to generate the second baseband current from the RF signal and turn on during the first portion of the four non-overlapping portions, during the third portion of the four non-overlapping portions, and during the fourth portion of the four non-overlapping portions to maintain the second baseband current in the second inductor; the third switch is configured to turn off during the third portion of the four non-overlapping portions to connect the input to the third inductor to generate the third baseband current from the RF signal and turn on during the first portion of the four non-overlapping portions, during the second portion of the four non-overlapping portions, and during the fourth portions of the four non-overlapping portions to maintain the third baseband current in the third inductor; and, the fourth switch is configured to turn off during the fourth portion of the four non-overlapping portions to connect the input to the fourth inductor to generate the fourth baseband current from the RF signal and turn on during the first portion of the four non-overlapping portions, during the second portion of the four non-overlapping portions, and during the third portion of the four non-overlapping portions to maintain the fourth baseband current in the fourth inductor.

According to another aspect of the present specification, the switching mixer comprises a first transimpedance amplifier configured to receive the first baseband current and to convert the first baseband current to a positive in-phase baseband voltage; a second transimpedance amplifier configured to receive the second baseband current and to convert the second baseband current to a positive quadrature phase baseband voltage; a third transimpedance amplifier configured to receive the third baseband current and to convert the first baseband current to a negative in-phase baseband voltage; and, a fourth transimpedance amplifier configured to receive the fourth baseband current and to convert the fourth baseband current to a negative quadrature phase baseband voltage.

According to another aspect of the present specification, the first inductor, the second inductor, the third inductor, and the fourth inductor are connected in series with the input; the first switch is connected in parallel with the first inductor; the second switch is connected in parallel with the second inductor; the third switch is connected in parallel with the third inductor; and the fourth switch is connected in parallel with the fourth inductor.

According to another aspect of the present specification, the first inductor, the second inductor, the third inductor, and the fourth inductor are connected in parallel to the input; the first switch is connected in between the input and the first inductor; the second switch is connected in between the input and the second inductor; the third switch is connected in between with the third inductor; and the fourth switch is connected in between the input and the fourth inductor.

According to another aspect of the present specification, the switching mixer further comprises: a fifth switch coupled to the first switch and configured to turn on based on the switching cycle when the first switch is turned off to maintain the first baseband in the first inductor; a sixth switch coupled to the second switch and configured to turn on based on the switching cycle when second switch is turn off to maintain the second baseband current in the second inductor; a seventh switch coupled to the third switch and configured to turn on when based on the switching cycle the third switch is turned off to maintain the third baseband current in the third inductor; and an eighth switch coupled to the fourth switch and configured to turn on based on the switching cycle when the fourth switch is turned off to maintain the fourth baseband current in the fourth inductor.

According to another aspect of the present specification, the switching mixer further comprises: a gate driver circuit configured to receive a clock signal from a local oscillator and generate the control signal having the switching cycle from the clock signal.

According to another aspect of the present specification, the switching mixer further comprises: a capacitor switching mixer coupled to the input and configured to provide a low-impedance path to ground for RF signals outside a tuned frequency of switching mixer.

Figure 2:
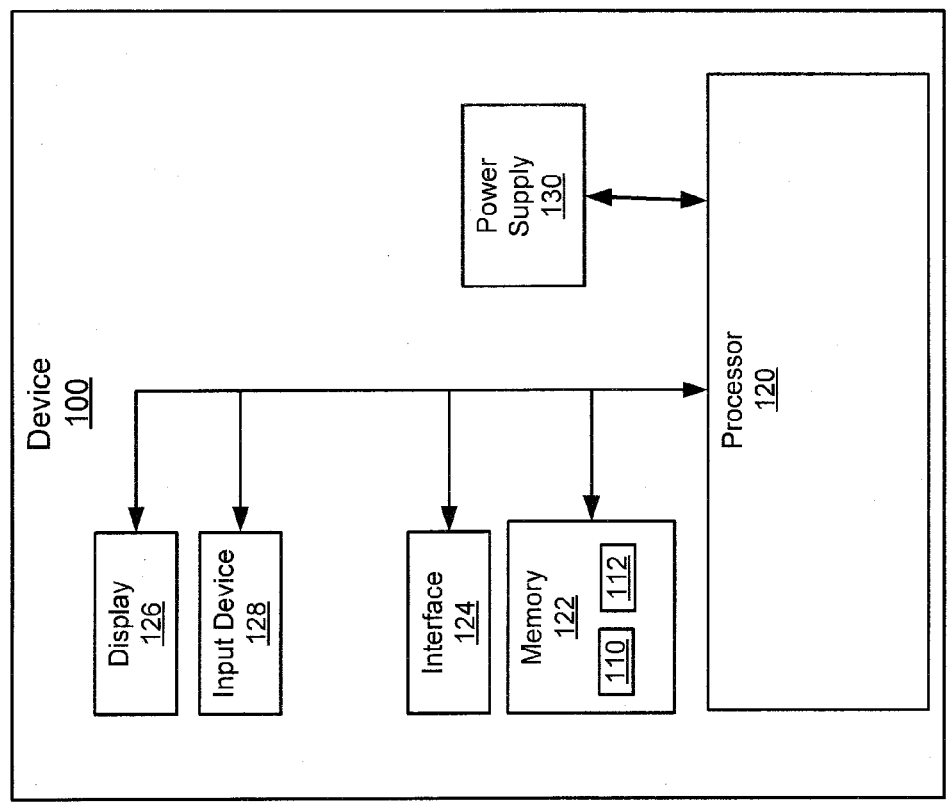
FIG. 2 is a block diagram of the mobile electronic device of FIG. 1 in accordance with an example implementation of the present specification.

Attention is next directed to FIG. 1 and FIG. 2 which respectively depict a front perspective view and a block diagram of a mobile electronic device 100, referred to interchangeably hereafter as device 100, according to an implementation of the present specification.

Device 100 may be any type of electronic device that can be used in a self-contained manner to communicate with one or more communication networks. Device 100 may include, but is not limited to, any suitable combination of electronic devices, communications devices, computing devices, personal computers, laptop computers, mobile electronic devices, mobile computing devices, mobile computing devices, tablet computing devices, laptop computing devices, desktop phones, telephones, PDAs (personal digital assistants), cellphones, smartphones, e-readers, internet-enabled appliances and the like. Other suitable devices are within the scope of present implementations.

It should be emphasized that the shape and structure of device 100 in FIG. 1 and FIG. 2 are purely examples, and contemplate a device that can be used for both wireless voice (e.g. telephony) and wireless data communications (e.g. email, web browsing, text, and the like). However, FIG. 1 contemplates a device that may be used for any suitable specialized functions, including, but not limited, to one or more of, telephony, computing, appliance, and/or entertainment related functions.

With reference to FIG. 1 and FIG. 2, device 100 includes multiple components, such as a processor 120 that controls the overall operation of the device 100. Processor 120 is coupled to and interacts with other components of device 100, including a memory 122, a communication interface 124, a display 126, at least one input device 128, and a power supply 130.

Input device 128 is generally configured to receive input data, and may include any suitable combination of input devices, including but not limited to a keyboard, a keypad, a pointing device (as depicted in FIG. 1), a mouse, a track wheel, a trackball, a touchpad, a touch screen and the like. Other suitable input devices are within the scope of present implementations.

Input from input device 128 is received at processor 120 (which can be implemented as a plurality of processors, and/or as one or more DSPs including but not limited to one or more central processors (CPUs)). Processor 120 is configured to communicate with memory 122 comprising a non-volatile storage unit (e.g. Erasable Electronic Programmable Read Only Memory ("EEPROM"), Flash Memory) and a volatile storage unit (e.g. random access memory ("RAM")). Programming instructions that implement the functional teachings of device 100 as described herein are typically maintained, persistently, in memory 122 and used by processor 120 which makes appropriate utilization of volatile storage during the execution of such programming instructions. Those skilled in the art will now recognize that memory 122 is an example of computer readable media that can store programming instructions executable on processor 120. Furthermore, memory 122 is also an example of a memory unit and/or memory module.

Device 100 also includes an operating system 110 and software programs or applications 112 that control basic device operations, including data and voice communication applications. Operating system 110 and the software programs or applications 112 are normally installed on the device 100 at manufacture and are typically stored in memory 122. Operating system 110 and the software programs or applications 112 are executed by the processor 120. Those skilled in the art will appreciate that portions of operating system 110 and software programs or applications 112, such as specific device applications, or parts thereof, may be temporarily loaded into volatile storage unit of memory 122. Other software programs can also be included, as is well known to those skilled in the art.

Processor 120 is further configured to communicate with display 126, which comprises any suitable one of, or combination of, flat panel displays (e.g. LCD (liquid crystal display), plasma displays, OLED (organic light emitting diode) displays, capacitive or resistive touchscreens, CRTs (cathode ray tubes) and the like.

Processor 120 is further configured to interact with communication interface 124 (interchangeably referred to interchangeably as interface 124), which may be implemented as one or more radios and/or connectors and/or network adaptors, configured to wirelessly communicate with one or more communication networks (not depicted). It will be appreciated that interface 124 is configured to correspond with network architecture that is used to implement one or more communication links to the one or more communication networks, including but not limited to any suitable combination of USB (universal serial bus) cables, serial cables, wireless links, cell-phone links, cellular network links (including but not limited to 2G, 2.5G, 3G, 4G+ such as UMTS (Universal Mobile Telecommunications System), GSM (Global System for Mobile Communications), CDMA (Code division multiple access), FDD (frequency division duplexing), LTE (Long Term Evolution), TDD (time division duplexing), TDD-LTE (TDD-Long Term Evolution), TD-SCDMA (Time Division Synchronous Code Division Multiple Access) and the like, wireless data, Bluetooth links, NFC (near field communication) links, WLAN (wireless local area network) links, WiFi links, WiMax links, packet based links, the Internet, analog networks, the PSTN (public switched telephone network), access points, and the like, and/or a combination.

Power supply 130 powers components of device 100 including, but not limited to processor 120, memory 122, interface 124, display 126, and input device 128. Power supply 130 may include, a battery, a power pack and the like; however, in other implementations, power supply 130 may include a connection to a mains power supply and/or a power adaptor (e.g. and AC-to-DC (alternating current to direct current) adaptor).

Figure 3:
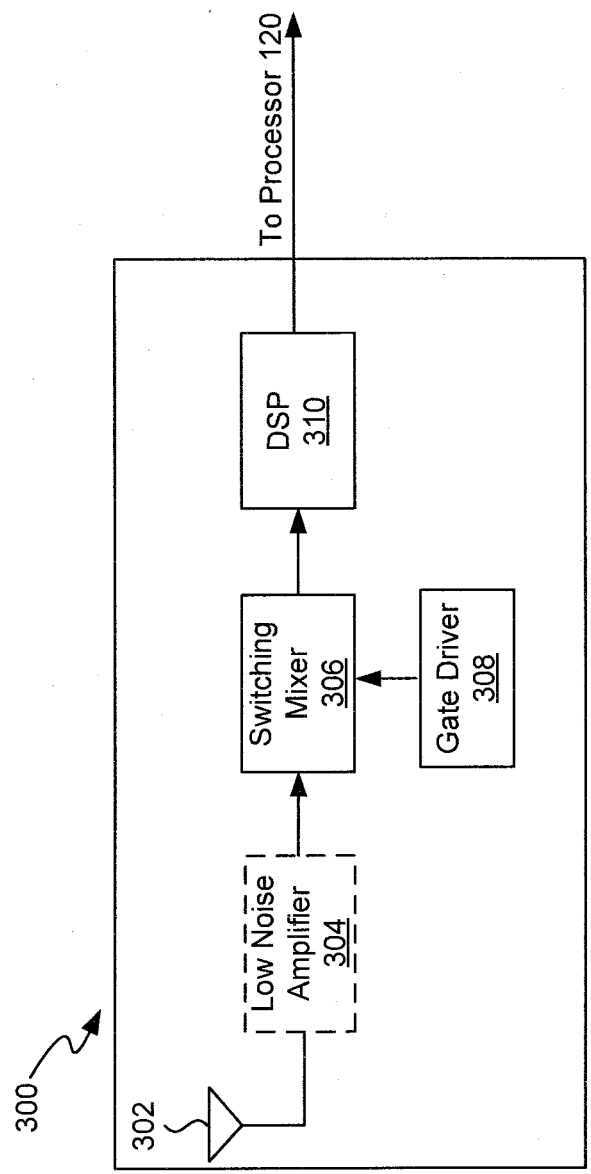
FIG. 3 is a block diagram of a radio frequency receiver that is implemented in the communication interface of FIG. 1 in accordance with an example implementation of the present specification.

Reference is now made to FIG. 3, which depicts a block diagram of a wireless radio frequency (RF) receiver 300 that forms part of interface 124 of device 100. Wireless RF receiver 300, referred to hereinafter as receiver 300, includes an antenna 302, a switching mixer 306, a gate driver 308, and a digital signal processor (DSP) 310. Antenna 302 is configured to receive, from a wireless network (not shown), a wideband RF signal which includes a downlink communication RF signal. Optionally, wireless receiver 300 may include a low noise amplifier 304 that is configured to increase the sensitivity of receiver 300 by amplifying weak portions of a downlink communication RF signal without contaminating the downlink communication RF signal with noise. Switching mixer 306 is configured to receive the downlink communication RF signal from either the antenna 302 directly or from low noise amplifier 304. Switching mixer 306 is further configured to be driven by gate driver 308, to down convert the downlink communication RF signal to a current and to convert the current to a filtered baseband output voltage. DSP 310 includes an analog-to-digital converter (not shown) and a digital signal processor (not shown) and is configured to receive the filtered baseband output voltage from switching mixer 306 and to convert the filtered baseband output voltage to a sampled digital signal. DSP 310 is further configured to process the sampled digital signal to reconstruct the information bearing baseband signal in a digital format and to provide the information bearing baseband signal in a digital format to processor 120.

Various implementations of switching mixer circuit 304 of FIG. 3 are described below with reference to FIGS. 4 and 5.

Figure 4:
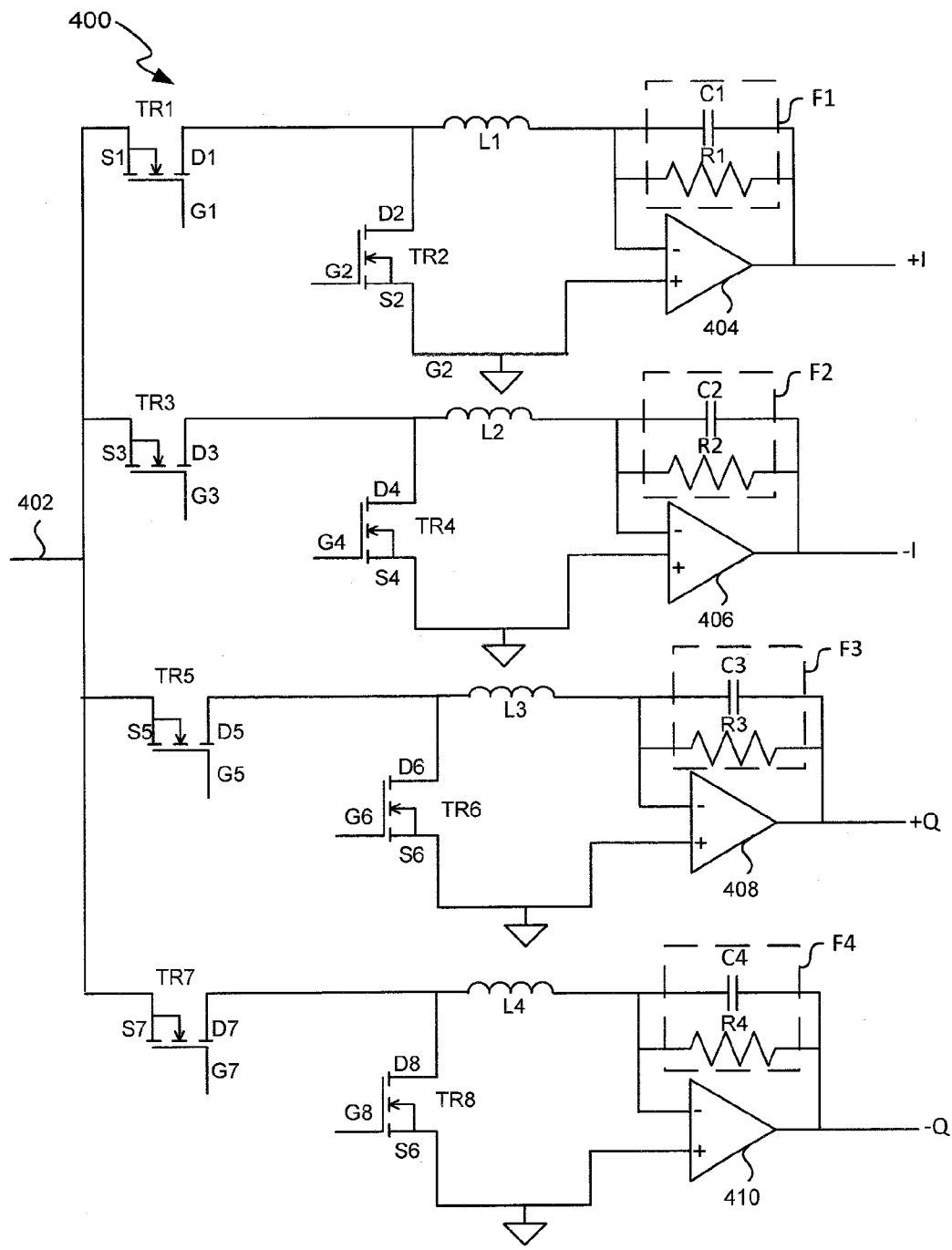
FIG. 4 is a circuit diagram of a parallel architecture of switching mixer of FIG. 3 in accordance with an example implementation of the present specification.

For example, attention is next directed to FIG. 4, which depicts components 400 of switching mixer 306 according to an example implementation of the present speciation. Switching mixer 306 may include components 400; however, switching mixer 306 may include other components not depicted in FIG. 4. Components 400 represent a parallel architecture for switching mixer 306.

Components 400 comprise: an input 402 that is connected to either directly to the antenna input 302 or an output of low noise amplifier 304 and configured to receive the downlink communication RF signal; transistors TR1, TR2, TR3, TR4, TR5, TR6, TR7, TR8; inductors L1, L2, L3, L4; transimpedance amplifiers 404, 406, 408, 410; and filters F1, F2, F3, and F4. In the present implementation, transistors TR1, TR2, TR3, TR4, TR5, TR6, TR7, TR8 act as switches.

As shown in FIG. 4, input 402 is connected to a source S1 of transistor TR1. Drain D1 of transistor TR1 is connected to a first terminal of inductor L1 and to drain D2 of transistor TR2. A second terminal of inductor L1 is connected to a negative input of transimpedance amplifier 404. The negative input of transimpedance amplifier 404 is also connected to output +I of transimpedance amplifier 404 though filter F1. Filter F1 comprises a capacitor C1 and a resistor R1 that are connected in parallel across the negative input and output +I of transimpedance amplifier 404. Both a positive terminal of transimpedance amplifier 404 and source S2 of transistor TR2 are connected to ground. Gate G1 of transistor TR1 and gate G2 of transistor TR2 are each connected to an output of gate driver 308 to receive a control signal having a switching cycle as described in further detail below.

Input 402 is also connected to source S3 of transistor TR3, source S5 of transistor TR5, and source S7 of transistor TR7. As shown in FIG. 4, drain D3 of transistor TR3 is connected to a first terminal of inductor L2 and to drain D4 of transistor TR4. A second terminal of inductor L2 is connected to a negative input of transimpedance amplifier 406. The negative input of transimpedance amplifier 406 is also connected to output −I of transimpedance amplifier 406 though a filter F2. Filter F2 comprises a capacitor C2 and a resistor R2 that are connected in parallel across the negative input and output −I of transimpedance amplifier 406. Both a positive terminal of transimpedance amplifier 406 and source S4 of transistor TR4 are connected to ground. Gate G3 of transistor TR3 and gate G4 of transistor TR4 are each connected to an output of gate driver 308 to receive the control signal having the switching cycle.

Drain D5 of transistor TR5 is connected to a first terminal of inductor L3 and to a drain D6 of transistor TR6. A second terminal of inductor L3 is connected to a negative input of transimpedance amplifier 408. The negative input of transimpedance amplifier 408 is also connected to an output +Q of transimpedance amplifier 408 though a filter F3. Filter F3 comprises a capacitor C3 and a resistor R3 that are connected in parallel across the negative input and output +Q of transimpedance amplifier 408. Both a positive terminal of transimpedance amplifier 408 and source S6 of transistor TR6 are connected to ground. Gate G5 of transistor TR5 and gate G6 of transistor TR6 are each connected to an output of gate driver 308 to receive the control signal having the switching cycle.

A drain D7 of transistor TR7 is connected to a first terminal of inductor L4 and to a drain D8 of transistor TR8. A second terminal of inductor L4 is connected to a negative input of transimpedance amplifier 408. The negative input of transimpedance amplifier 408 is also connected to output −Q of transimpedance amplifier 408 though a filter F4. Filter F4 comprises a capacitor C4 and a resistor R4 that are connected in parallel across the negative input and output −Q of transimpedance amplifier 410. Both a positive terminal of transimpedance amplifier 408 and source S8 of transistor TR8 is also connected to ground. Gate G7 of transistor TR7 and gate G8 of transistor TR8 are each connected to an output of gate driver 308 to receive the control signal having the switching cycle.

The operation of components 400 will now be described with reference to FIG. 4. In operation, a downlink communication RF signal is received at input 402. Gate driver 308 generates a control signal having a switching cycle with a quadrature sequence (i.e., four non-overlapping portions or duty cycles and four overlapping portions or duty cycles). The non-overlapping portions of the control signal generated by the gate driver 308 are provided to gates G1, G3, G5, G7 of transistors TR1, TR3, TR5, TR7, respectively, and the overlapping portions of the control signal are provided to gates G2, G4, G6, G8 of transistors TR2, TR4, TR6, TR8, respectively.

During a first portion of the switching cycle, transistors TR1, TR4, TR6, and TR8 are turned on and transistors TR2, TR3, TR5, and TR7 are turned off, which results in: input 402 being connected to the first terminal of inductor L1; inductor L2 being connected between the negative input terminal of transimpedance amplifier 406 and ground; inductor L3 being connected between the negative input terminal of transimpedance amplifier 408 and ground; and inductor L4 being connected between the negative input terminal of transimpedance amplifier 410 and ground. When input 402 is connected to the first terminal of inductor L1, the downlink communication RF signal is provided to inductor L1, which generates a current that is provided to the negative input terminal of transimpedance amplifier 404. Transimpedance amplifier 404 is configured to convert the current to a positive in-phase baseband voltage +I that is provided to DSP 310 for further processing. Transimpedance amplifier 404 and filter F1 are further configured to provide amplification and additional low-pass filtering to the positive in-phase baseband voltage +I.

During a second portion of the switching cycle, transistors TR2, TR4, TR5, and TR8 are turned on and transistors TR1, TR3, TR6, and TR7 are turned off, which results in: input 402 being connected to the first terminal of inductor L3; and inductor L1 being connected between the negative input terminal of transimpedance amplifier 404 and ground; inductor L2 being connected between the negative input terminal of transimpedance amplifier 406 and ground; and L4 being connected between the negative input terminal of transimpedance amplifier 410 and ground. When input 402 is connected to the first terminal of inductor L3, inductor L3 generates a current that is provided to negative input terminal of transimpedance amplifier 408. Transimpedance amplifier 408 is configured to convert the current to a positive quadrature phase baseband voltage +Q that is provided to DSP 310 for further processing. Transimpedance amplifier 408 and filter F3 are further configured to provide amplification and additional low-pass filtering to the positive quadrature phase baseband voltage +Q.

During a third portion of the switching cycle, transistors TR2, TR3, TR6, and TR8 are turned on and transistors TR1, TR4, TR5, and TR7 are turned off, which results in: input 402 being connected to the first terminal of inductor L2; inductor L1 being connected between the negative input terminal of transimpedance amplifier 404 and ground; inductor L3 being connected between the negative input terminal of transimpedance amplifier 408 and ground; and inductor L4 being connected between the negative input terminal of transimpedance amplifier 410 and ground. When input 402 is connected to the first terminal of inductor L2, inductor L2 generates a current that is provided to negative input terminal of transimpedance amplifier 406. Transimpedance amplifier 406 is configured to convert the current to a negative in-phase baseband voltage −I that is provided to DSP 310 for further processing. Transimpedance amplifier 406 and filter F2 are also configured to provide amplification and additional low-pass filtering to the negative in-phase baseband voltage −I.

During a fourth portion of the switching cycle, transistors TR2, TR4, TR6, and TR7 are turned on and transistors TR1, TR3, TR5, and TR8 are turned off, which results in: the input 402 being connected to the first terminal of inductor L4; inductor L1 being connected between the negative input terminal of transimpedance amplifier 404 and ground, inductor L2 being connected between the negative input terminal of transimpedance amplifier 406 and ground; and inductor L3 being connected between the negative input terminal of transimpedance amplifier 408 and ground. When the input 402 is connected to the first terminal of inductor L4, inductor L4 generates a current that is provided to negative input terminal of transimpedance amplifier 410. Transimpedance amplifier 410 is configured to convert the current to a negative quadrature phase baseband voltage −Q that is provided to DSP 310 for further processing. Transimpedance amplifier 410 and filter F4 are further configured to provide amplification and additional low-pass filtering to the negative quadrature phase baseband voltage −Q.

In the implementation shown in FIG. 4, each transistor TR1, TR2, TR3, TR4, TR5, TR6, TR7, and TR8 alternates between being turned on and turned off. In particular implementations each transistor TR1, TR3, TR5, TR7 is turned on for 25 percent of the switching cycle or less and turned off for 75 percent of the switching cycle or more. Each transistor TR2, TR4, TR6, TR8 is turned on for 75 percent of the switching cycle or more and turned off for 25 percent of the switching cycle or less. When the respective inductors L1, L2, L3, L4 are connected between ground and the negative terminals of transimpedance amplifiers 404, 406, 408, 410, respectively, current in inductors L1, L2, L3, L4 is maintained constant at its value at the end of the last active portion of the switching cycle, i.e. the portion of the switching cycle when a particular inductor is connected to input 402.

Figure 5:
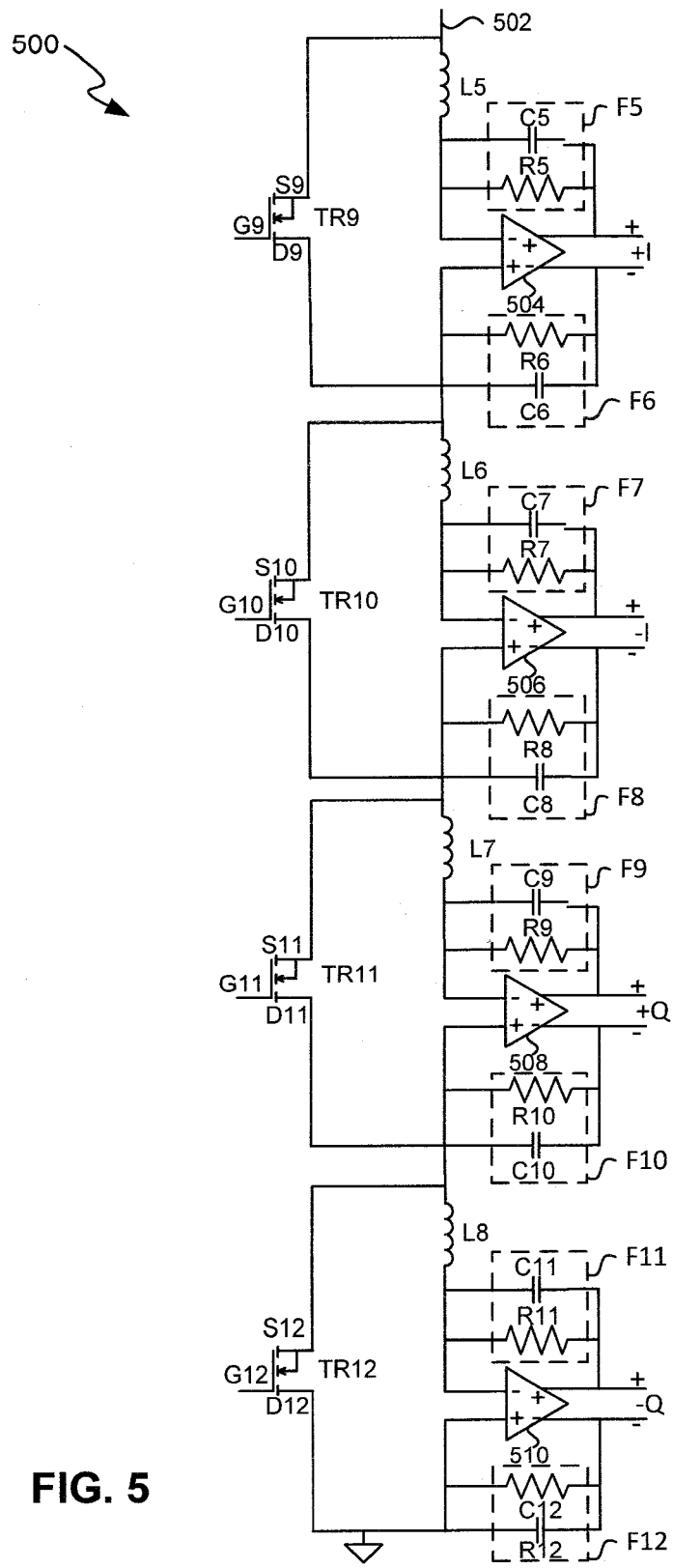
FIG. 5 is a circuit diagram of an inline architecture of switching mixer of FIG. 3 in accordance with another example implementation of the present specification.

Attention is next directed to FIG. 5, which depicts components 500 of switching mixer 306 according to an example implementation of the present specification. Switching mixer 306 may include components 500; however, switching mixer 306 may include other components not depicted in FIG. 5. Components 500 represent an inline architecture for switching mixer 306.

Components 500 comprise: an input 502 that is configured to receive a downlink communication RF signal; transistors TR9, TR10, TR11, TR12; inductors L5, L6, L7, L8; transimpedance amplifiers 504, 506, 508, 510; and filters F5, F6, F7, F8, F9, F10, F11, F12. In the implementation shown in FIG. 5, transistors TR9, TR10, TR11, TR12 act as switches and each transimpedance amplifier 504, 506, 508, 510 outputs a differential voltage.

As shown in FIG. 5, input 502 is connected to a first terminal of inductor L5 and to source S9 of transistor TR9. A second terminal of inductor L5 is connected to a negative input terminal of transimpedance amplifier 504. Drain D9 of transistor TR9 is connected to a positive input terminal of transimpedance amplifier 504, a first terminal of inductor L6, and source S10 of transistor TR10. A second terminal of inductor L6 is connected to a negative input of transimpedance amplifier 506. Drain D10 of transistor TR10 is connected to a positive terminal of transimpedance amplifier 506, a first terminal of inductor L7, and source S11 of transistor TR11. A second terminal of inductor L7 is connected a negative input of transimpedance amplifier 508. Drain D10 of transistor TR10 is connected to a positive terminal of transimpedance amplifier 508, a first terminal of inductor L8, and source S12 of transistor TR12. A second terminal of inductor L8 is connected to a negative input of transimpedance amplifier 510. Drain D12 of transistor TR12 is connected to a positive terminal of transimpedance amplifier 510 and to ground.

Filter F5 comprises capacitor C5 and resistor R5 that are connected in parallel between the negative input terminal and a positive output terminal of transimpedance amplifier 504. Filter F6 comprises capacitor C6 and resistor R6 that are connected in parallel between the positive input terminal and a negative output terminal of transimpedance amplifier 504. The positive and negative output terminals of transimpedance amplifier 504 form positive differential in-phase output +I that is provided to DSP 310.

Filter F7 comprises capacitor C7 and resistor R7 that are connected in parallel between the negative input terminal and a positive output terminal of transimpedance amplifier 506. Filter F8 comprises capacitor C8 and resistor R8 that are connected in parallel between the positive input terminal and a negative output terminal of transimpedance amplifier 506. The positive and negative output terminals of transimpedance amplifier 506 form negative differential in-phase output −I that is provided to DSP 310.

Filter F9 comprises capacitor C9 and resistor R9 that are connected in parallel between the negative input terminal and a positive output terminal of transimpedance amplifier 508. Filter F10 comprises capacitor C10 and resistor R10 that are connected in parallel between the positive input terminal and a negative output terminal of transimpedance amplifier 508. The positive and negative output terminals of transimpedance amplifier 508 form positive differential quadrature phase output +Q that is provided to DSP 310.

Filter F1 comprises capacitor C11 and resistor R11 that are connected in parallel between the negative input terminal and a positive output terminal of transimpedance amplifier 504. Filter F12 comprises capacitor C12 and resistor R12 that are connected in parallel between the positive input terminal and a negative output terminal of transimpedance amplifier 510. The positive and negative output terminals of transimpedance amplifier 510 form negative differential in-phase output −Q that is provided to DSP 310.

Referring again to FIG. 5, Gates G9, G10, G11, G12 of transistors TR9, TR10, TR11, TR12 are each connected to an output of gate driver 308 to receive the control signal having a switching cycle.

The operation of components 500 will now be described with reference to FIG. 5. In operation, the downlink communication RF signal is received at input 502. Gate driver 308 generates a control signal having a switching cycle with quadrature sequence (i.e., four non-overlapping portions or duty cycles). The control signal generated by the gate driver 308 is provided to gates G9, G10, G11, G12 of transistors TR9, TR10, TR11, TR12.

During a first portion of the switching cycle, transistor TR9 is turned off and transistors TR10, TR11, TR12 are turned on, which results in the downlink communication RF signal being connected to the first terminal of inductor L5 and the first terminal of each inductor L6, L7, L8 being connected to ground through transistors TR10, TR11, TR12, respectively. Inductor L5 generates a current that is provided to the negative terminal of transimpedance amplifier 504. Transimpedance amplifier 504 is configured to convert the current to a positive differential in-phase baseband voltage +I that is provided to DSP 310 for further processing. Transimpedance amplifier 504 and filters F5, F6 are further configured to provide amplification and additional low-pass filtering to the positive differential in-phase baseband voltage +I.

During the same first portion of the switching cycle, inductor L6 is connected between the negative and positive input terminals of transimpedance amplifier 504, inductor L7 is connected between the negative and positive input terminals of transimpedance amplifier 506, an inductor L8 is connected between the negative and positive input terminals of transimpedance amplifier 508. Hence, current in each inductor L6, L7, L8 is maintained constant at its value at the end of a last active portion of the switching cycle, i.e. a portion of the switching cycle when a particular inductor L6, L7, L8 is connected to input 502.

During a second portion of the switching cycle, transistor TR11 is turned off and transistors TR9, TR10, TR11 are turned on, which results in the downlink communication RF signal being connected to the first terminal of inductor L7 and the first terminal of each inductor L5, L6, L8 being connected to ground through transistors TR9, TR10, TR12, respectively. Inductor L7 generates a current that is provided to the negative terminal of transimpedance amplifier 508. Transimpedance amplifier 508 is configured to convert the current to a positive differential in-phase baseband voltage +Q that is provided to DSP 310 for further processing. Transimpedance amplifier 508 and filters F9, F10 are further configured to provide amplification and additional low-pass filtering to the positive differential in-phase baseband voltage +Q.

During the same second portion of the switching cycle, inductor L5 is connected between the negative and positive input terminals of transimpedance amplifier 504, inductor L6 is connected between the negative and positive input terminals of transimpedance amplifier 506, and inductor L8 is connected between the negative and positive input terminals of transimpedance amplifier 510. Hence, current in each inductor L5, L6, L8 is maintained constant at its value at the end of a last active portion of the switching cycle, i.e. the portion of the switching cycle when a particular inductor L5, L6, L8 is connected to input 502.

During a third portion of the switching cycle, transistor TR10 is turned off and transistors TR9, TR11, TR12 are turned on, which results in the downlink communication RF signal being connected to the first terminal of inductor L6 and the first terminal of each inductor L5, L7, L8 being connected to ground through transistors TR8, TR10, TR11, respectively. Inductor L6 generates a current that is provided to the negative terminal of transimpedance amplifier 506. Transimpedance amplifier 506 is configured to convert the current to a negative differential in-phase baseband voltage −I that is provided to DSP 310 for further processing. Transimpedance amplifier 506 and filters F7, F8 are further configured to provide amplification and additional low-pass filtering to the negative differential in-phase baseband voltage −I.

During the same third portion of the switching cycle, inductor L6 is connected between the negative and positive input terminals of transimpedance amplifier 504, inductor L5 is connected between the negative and positive input terminals of transimpedance amplifier 508, and inductor L8 is connected between the negative and positive input terminals of transimpedance amplifier 510. Hence, current in each inductor L5, L7, L8 is maintained constant at its value at the end of a last active portion of the switching cycle, i.e. the portion of the switching cycle when a particular inductor L5, L7, L8 is connected to input 502.

During a fourth portion of the switching cycle, transistor TR12 is turned off and transistors TR9, TR10, TR11 are turned on, which results in the downlink communication RF signal being connected to the first terminal of inductor L8 and the first terminal of each inductor L5, L6, L7 being connected to ground through transistors TR9, TR10, TR11, respectively. Inductor L8 generates a current that is provided to the negative terminal of transimpedance amplifier 510. Transimpedance amplifier 510 is configured to convert the current to a negative differential in-phase baseband voltage −Q that is provided to DSP 310 for further processing. Transimpedance amplifier 510 and filters F11, F12 are further configured to provide amplification and additional low-pass filtering to the negative differential in-phase baseband voltage −Q.

During the same fourth portion of the switching cycle, inductors L5 is connected between the negative and positive input terminals of transimpedance amplifier 504, inductor L6 is connected between the negative and positive input terminals of transimpedance amplifier 506, and inductor L7 is connected between the negative and positive input terminals of transimpedance amplifier 508. Hence, current in each inductor L5, L6, L7 is maintained constant at its value at the end of a last active portion of the switching cycle, i.e. the portion of the switching cycle when a particular inductor L5, L6, L7 is connected to input 502.

Figure 6:
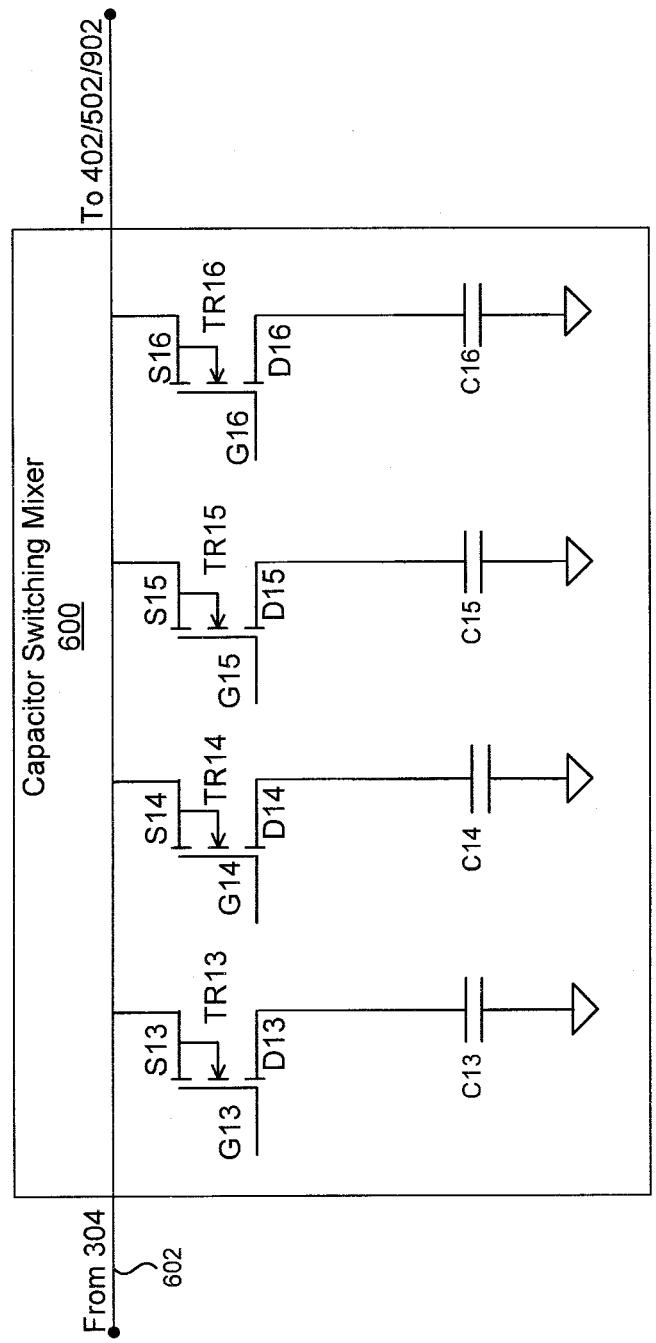
FIG. 6 is a circuit diagram of a capacitive based switching mixer for use with the switching mixer of the present specification.

Attention is next directed to FIG. 6, which depicts a capacitor based switching mixer 600 that is used in conjunction with switching mixer 306 in accordance with an example implementation of the present specification. Capacitor based switching mixer 600 includes an input 602 that is configured to receive the RF signal from low noise amplifier 302, transistors TR13, TR14, TR15, TR16, and capacitors C13, C14, C15, C16. Input 602 is connected to source S12, S13, S14, S15 of each transistor TR13, TR14, TR15, TR16. Input 602 is also connected to either input 402 of components 400 or input 502 of components 500. A drain D13 of transistor TR13 is connected to a first terminal of capacitor C13. Similarly, drain D14 of transistor TR14 is connected to a first terminal of capacitor C14, drain D15 of transistor TR15 is connected to a first terminal of capacitor C15, and drain D16 of transistor TR16 is connected to a first terminal of capacitor C16. A second terminal of each capacitor C13, C14, C15, C16 is connected to ground.

When the capacitor based switching mixer 600 is used in conjunction with the inductor based switching mixer 306 of the present specification, the capacitor based switching mixer 600 acts as a bandpass filter, which creates a low impedance path to ground for signals outside of a tuned frequency of switching mixer 306. By using a capacitor based mixer in conjunction with the inductor based mixer 304 of the present specification, a second order tunable filter effect is provided for rejecting blocking signals.

Figure 7:
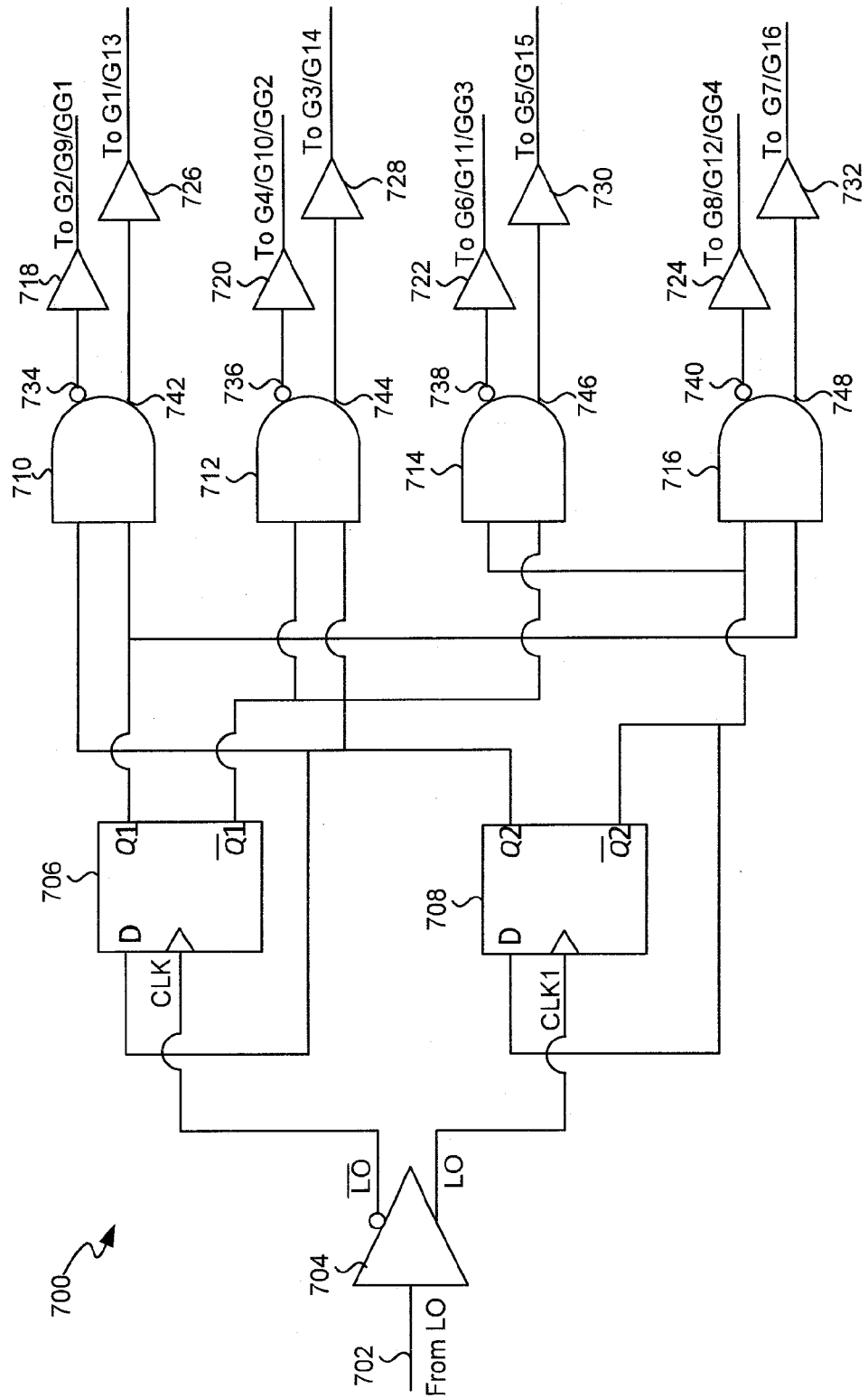
FIG. 7 is a circuit diagram of a gate driver of the receiver of FIG. 3 in accordance with example implementation of the present specification.
Figure 8:
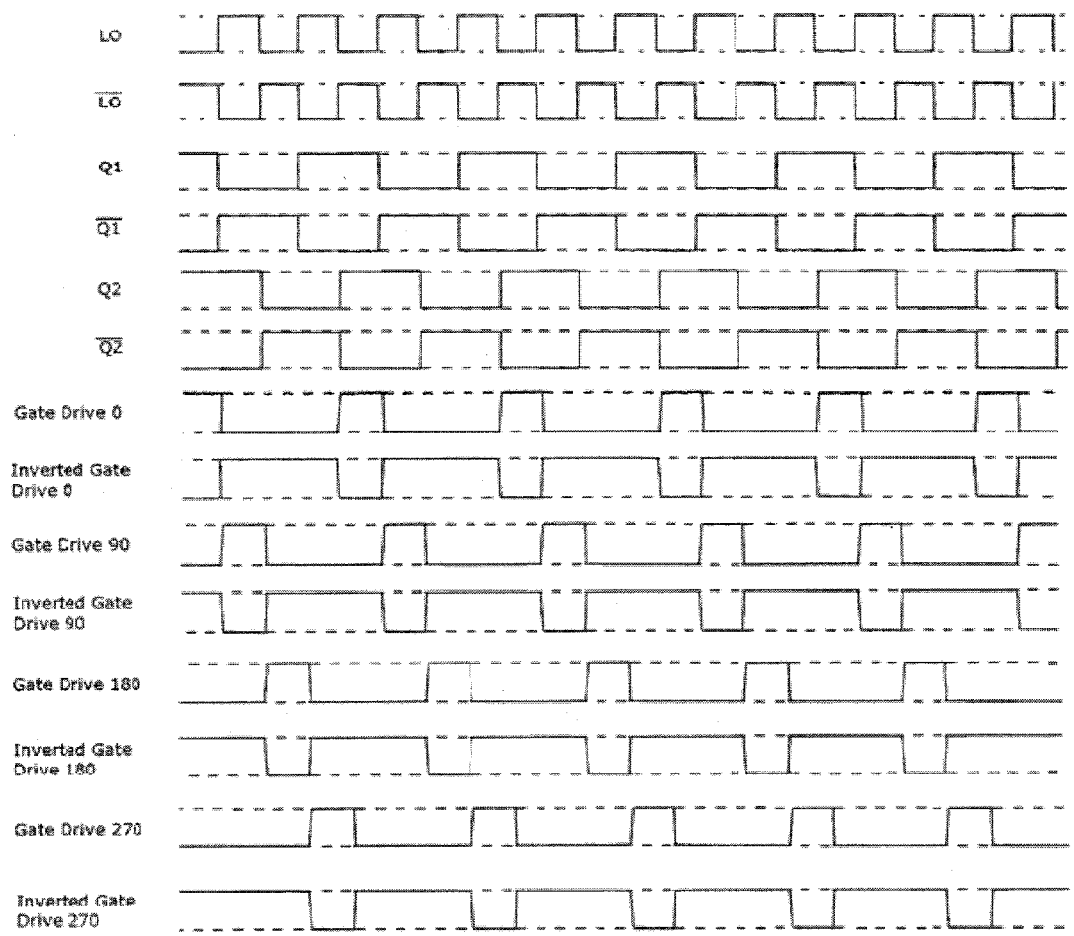
FIG. 8 is a timing diagram for the gate drive of FIG. 7.

Attention is next directed to FIG. 7 and FIG. 8, which depict a circuit diagram of gate driver 308 and a timing diagram for gate driver 308, respectively, according to an example implementation of the present speciation. Gate driver 308 may include components 700; however, gate driver 308 may include other components not depicted in FIG. 7.

Components 700 comprise: an input 702 configured to receive a clock signal from a local oscillator (not shown) of device 100, a differential buffer 704, flip flops 706, 708, AND/NAND gates 710, 712, 714, 716, and power amplifiers 718, 720, 722, 724, 726, 728, 730, 732.

A square wave input signal from a local oscillator (not shown) is received at input 702 is passed through differential buffer 704 that has an inverting output $\overline{LO}$ and a non-inverting output LO. Inverting output $\overline{LO}$ of buffer 704 is connected to the clock input CLK1 of flip flop 706 and non-inverting output LO is connected to the clock input CLK1 of flip flop 708. Flip flop 708 divides the input LO signal by 2 and provides a differential output Q2 and $\overline{Q2}$. Flip flop 706 divides the inverted LO signal by 2, and provides a differential output Q1 and $\overline{Q1}$, which is out of phase from Q2 and $\overline{Q2}$ by 90 degrees. These signals are then combined in two input AND/NAND gates 710, 712, 714, 716 for every combination of two signals. NAND output 734 is input to power amplifier 718 and used to drive gates G2, G9, GG1; NAND output 736 is input to power amplifier 720 and used to drive gates G4, G10, GG2; NAND output 738 is input to power amplifier 722 and used to drive gates G6, G11, GG3; and NAND output 740 is input to power amplifier 724 and used to drive gates G8, G1, GG4. AND output 742 is input to power amplifier 726 and used to drive gates G1, G13; AND output 744 is input to power amplifier 728 and used to drive gates G5, G15; AND output 746 is input to power amplifier 730 and used to drive gates G5, G15; and AND output 748 is input to power amplifier 732 and used to drive gates G7, G16.

The inductor based switching mixer of the present disclosure enables a single RF receiver to reject blocking signals without the use of static front-end filters. Further, the inductor based switching mixer of the present disclosure obtains high linearity for rejecting blocking signals.

Figure 9:
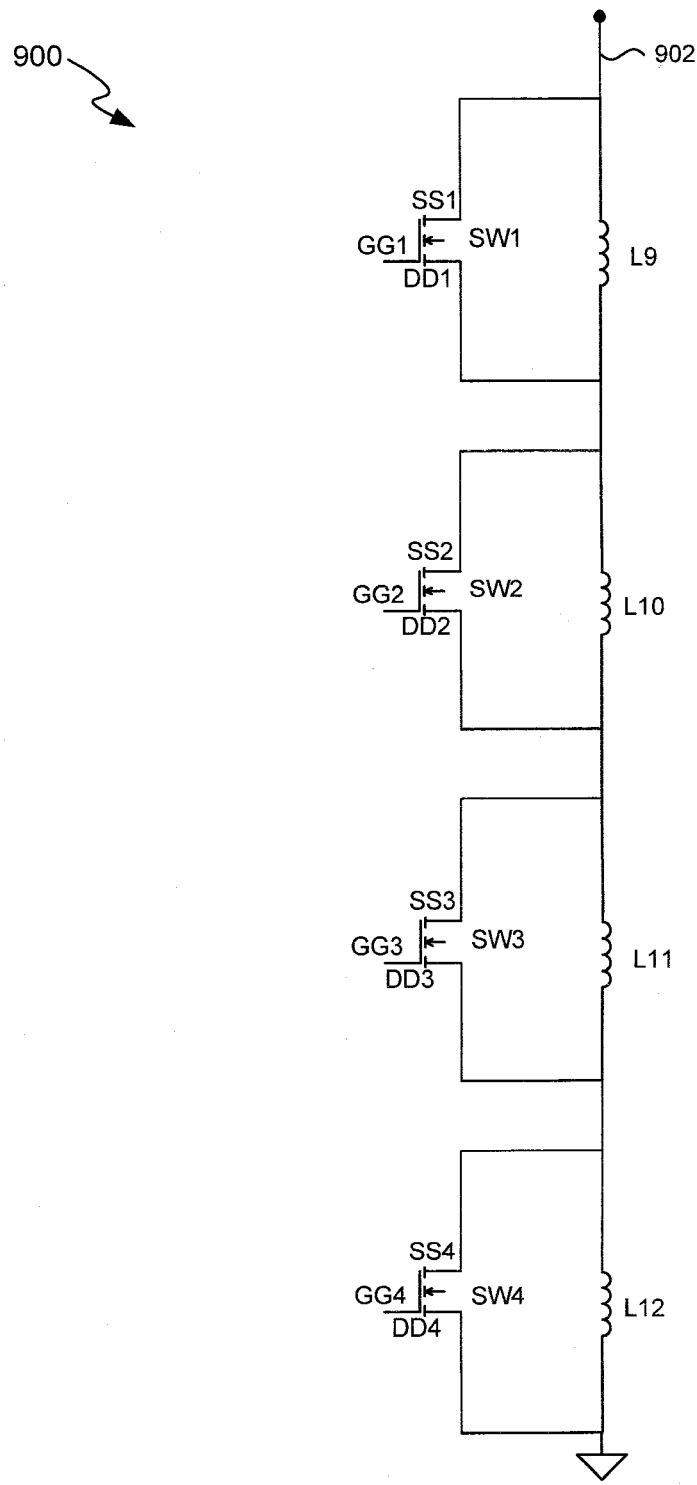
FIG. 9 is a circuit diagram of a switching mixer in accordance with another example implementation of the present specification.

Attention is next directed to FIG. 9, which depicts another implementation of the switching mixer in accordance with the present specification. In the implementation shown in FIG. 9, the architecture of switching mixer 900 is applicable to other applications, such as, for example, a tunable filter.

Switching mixer 900 comprises: an input 902 that is configured to receive an input RF signal; a set of switches SW1, SW2, SW3, SW4; and a set of inductors L9, L10, L11, L12. In the implementation shown in FIG. 9, each switch SW1, SW2, SW3, SW4 in the set of switches is a transistor. However, it will be apparent to a person of skill in art each switch SW1, SW2, SW3, SW4 in the set of switches may be any suitable type of switch.

As shown in FIG. 9, the set of switches SW1, SW2, SW3, SW4 are in a one-to-one relationship with the set of inductors L9, L10, L11, L12. That is, switch SW1 and inductor L9 are in a one-to-one relationship; switch SW2 and inductor L10 are in a one-to-one relationship; switch SW3 and inductor L11 are in a one-to-one relationship; and switch SW4 and inductor L12 are in a one-to-one relationship. Input 902 is connected to a first terminal of inductor L9. Inductors L9, L10, L11, L12 are connected in series to ground.

Input 902 and the first terminal of inductor L9 are each connected to source SS1 of switch SW1. The second terminal of inductor L9 and the first terminal of inductor L10 are each connected to drain DD1 of switch SW1 and to the source SS2 of switch SW2. The second terminal of inductor L10 and the first terminal of inductor L11 are each connected to drain DD2 of switch SW2 and to source SS3 of switch SW3. The second terminal of inductor L11 and the first terminal of inductor L11 are each connected to drain DD3 to switch SW3 and to source SS4 of switch SW4. The second terminal of inductor L12 is connected to both drain of switch SW4 and to ground.

Gates GG1 GG2, GG3, GG4 of switches SW1, SW2, SW3, SW4 are each connected to an output of gate driver 308 to receive a quadrature sequence of a switching cycle.

The operation of switching mixer 900 will now be described with reference to FIG. 9. In operation, an RF signal is received at input 902. Gate driver 308 generates a control signal having a switching cycle with quadrature sequence (i.e., four non-overlapping portions or duty cycles). The control signal generated by the gate driver 308 is provided to gates GG1 GG2, GG3, GG4 of switches SW1, SW2, SW3, SW4.

During a first portion of the switching cycle, switch SW1 is turned off and switches SW2, SW3, SW4 are turned on, which results in the input RF signal being connected to the first terminal of inductor L9 and the first terminal of each inductor L10, L11, L12 being connected to ground through switches SW2, SW3, SW4, respectively. During the same first portion of the switching cycle, current in each inductor L10, L11, L12 is maintained constant at its value at the end of a last active portion of the switching cycle, i.e. a portion of the switching cycle when a particular inductor L10, L11, L12 is connected to input 902.

During a second portion of the switching cycle, switch SW3 is turned off and switches SW1, SW2, SW4 are turned on, which results in the input RF signal being connected to the first terminal of inductor L11. During the same second portion of the switching cycle, current in each inductor L9, L10, L12 is maintained constant at its value at the end of a last active portion of the switching cycle, i.e. the portion of the switching cycle when a particular inductor L9, L10, L12 is connected to input 902.

During a third portion of the switching cycle, switch SW3 is turned off and switches SW1, SW2, SW4 are turned on, which results in the input RF signal being connected to the first terminal of inductor L10. During the same third portion of the switching cycle, current in each inductor L9, L11, L12 is maintained constant at its value at the end of a last active portion of the switching cycle, i.e. the portion of the switching cycle when a particular inductor L9, L11, L12 is connected to input 902.

During a fourth portion of the switching cycle, switch SW4 is turned off and switches SW1, SW2, SW3 are turned on, which results in the input RF signal being connected to the first terminal of inductor L12. During the same fourth portion of the switching cycle, current in each inductor L9, L10, L11 is maintained constant at its value at the end of a last active portion of the switching cycle, i.e. the portion of the switching cycle when a particular inductor L9, L10, L11 is connected to input 902.

Those skilled in the art will appreciate that in some implementations, the functionality of the gate-driver can be implemented using pre-programmed hardware or firmware elements (e.g., application specific integrated circuits (ASICs), electrically erasable programmable read-only memories (EEPROMs), etc.), or other related components. In other implementations, the functionality of the gate-driver may be achieved using a computing apparatus that has access to a code memory (not depicted) which stores computer-readable program code for operation of the computing apparatus. The computer-readable program code could be stored on a computer readable storage medium which is fixed, tangible and readable directly by these components, (e.g., removable diskette, CD-ROM, ROM, fixed disk, USB drive). Furthermore, the computer-readable program can be stored as a computer program product comprising a computer usable medium. Further, a persistent storage device can comprise the computer readable program code. The computer-readable program code and/or computer usable medium can comprise a non-transitory computer-readable program code and/or non-transitory computer usable medium. Alternatively, the computer-readable program code could be stored remotely but transmittable to these components via a modem or other interface device connected to a network (including, without limitation, the Internet) over a transmission medium. The transmission medium can be either a non-mobile medium (e.g., optical and/or digital and/or analog communications lines) or a mobile medium (e.g., microwave, infrared, free-space optical or other transmission schemes) or a combination thereof.

A portion of the specification of this patent document contains material which is subject to copyright protection. The copyright owner has no objection to the facsimile reproduction by any one of the patent document or patent specification, as it appears in the Patent and Trademark Office patent file or records, but otherwise reserves all copyrights whatsoever.

Persons skilled in the art will appreciate that there are yet more alternative implementations and modifications possible, and that the above examples are only illustrations of one or more implementations. The scope, therefore, is only to be limited by the claims appended hereto.

What is claimed is:

1. A switching mixer, comprising:
an input configured to receive a radio frequency (RF) signal;
a set of inductors; and,
a set switches in a one-to-one relationship with the set of inductors, the set of switches configured to alternate turning off in a quadrature sequence of a switching cycle,
wherein when a respective switch of the set of switches is turned off:
the respective switch connects the input to a respective inductor of the set of inductors to convert the RF signal to a baseband current; and
each remaining inductor of the set of inductors is configured to maintain current therein.

2. The switching mixer of claim 1, wherein when the respective switch of the set of switches is turned on:
the respective switch shorts out the respective inductor, to maintain the current in the respective inductor.

3. The switching mixer of claim 1, wherein each respective inductor of the set of inductors is connected in series and each respective switch is connected in parallel with the respective inductor in the set of inductors.

4. The switching mixer of claim 3, further comprising:
a set of transimpedance amplifiers in a one-to-one relationship with the set of inductors, each transimpedance amplifier in the set of transimpedance amplifiers being configured to convert the baseband current to a baseband voltage.

5. The switching mixer of claim 1, wherein each respective inductor in the set of inductors is connected in parallel with the input.

6. The switching mixer of claim 5, further comprising:
a second set of switches configured to alternate turning on in the quadrature sequence of the switching cycle; and,
a set of transimpedance amplifiers in a one-to-one relationship with the set of inductors, each transimpedance amplifier in the set of transimpedance amplifiers being configured to convert the baseband current to a baseband voltage.

7. The switching mixer of claim 6, wherein when a respective switch of the second set of switches is turned off:
the respective switch isolates the respective inductor, the respective switch and the respective transimpedance amplifier from the input.

8. The switching mixer of claim 1, further comprising:
a gate driver circuit configured to receive a clock signal from a local oscillator and generate the quadrature sequence of the switching cycle from the clock signal.

9. The switching mixer of claim 1, further comprising:
a capacitor switching mixer coupled to the input and configured to provide a low-impedance path to ground for RF signals outside a tuned frequency of the switching mixer.

10. A switching mixer, comprising:
an input configured to receive a radio frequency (RF) signal;
a first switch configured to receive a control signal having a switching cycle and to turn off to connect the input to a first inductor to generate a first baseband current from the RF signal and turn on to maintain the first baseband current in the first inductor based on the switching cycle;
a second switch configured to receive the control signal and to turn off to connect the input to a second inductor to generate a second baseband current from the RF signal and turn on to maintain the second baseband current in the second inductor based on the switching cycle;
a third switch configured to receive the control signal and to turn off to connect the input to a third inductor to generate a third baseband current from the RF signal and turn on to maintain the third baseband current in the third inductor based on the switching cycle; and
a fourth switch configured to receive the control signal and to turn off to connect the input to a fourth inductor to generate a fourth baseband current from the RF signal and turn on to maintain the fourth baseband current in the fourth inductor based on the switching cycle.

11. The switching mixer of claim 10, wherein the switching cycle comprises four non-overlapping portions.

12. The switching mixer of claim 11, wherein
the first switch is configured to turn off during a first portion of the four non-overlapping portions to connect the input to the first inductor to generate the first baseband current from the RF signal and turn on during a second portion of the four non-overlapping portions, during a third portion of the four non-overlapping portions, and during a fourth portion of the four non-overlapping portions to maintain the first baseband current in the first inductor;
the second switch is configured to turn off during the second portion of the four non-overlapping portions to connect the input to the second inductor to generate the second baseband current from the RF signal and turn on during the first portion of the four non-overlapping portions, during the third portion of the four non-overlapping portions, and during the fourth portion of the four non-overlapping portions to maintain the second baseband current in the second inductor;
the third switch is configured to turn off during the third portion of the four non-overlapping portions to connect the input to the third inductor to generate the third baseband current from the RF signal and turn on during the first portion of the four non-overlapping portions, during the second portion of the four non-overlapping portions, and during the fourth portions of the four non-overlapping portions to maintain the third baseband current in the third inductor; and, the fourth switch is configured to turn off during the fourth portion of the four non-overlapping portions to connect the input to the fourth inductor to generate the fourth baseband current from the RF signal and turn on during the first portion of the four non-overlapping portions, during the second portion of the four non-overlapping portions, and during the third portion of the four non-overlapping portions to maintain the fourth baseband current in the fourth inductor.

13. The switching mixer of claim 10, further comprising:
a first transimpedance amplifier configured to receive the first baseband current and to convert the first baseband current to a positive in-phase baseband voltage;
a second transimpedance amplifier configured to receive the second baseband current and to convert the second baseband current to a positive quadrature phase baseband voltage;
a third transimpedance amplifier configured to receive the third baseband current and to convert the first baseband current to a negative in-phase baseband voltage; and,
a fourth transimpedance amplifier configured to receive the fourth baseband current and to convert the fourth baseband current to a negative quadrature phase baseband voltage.

14. The switching mixer of claim 10, wherein
the first inductor, the second inductor, the third inductor, and the fourth inductor are connected in series with the input;
the first switch is connected in parallel with the first inductor;
the second switch is connected in parallel with the second inductor;
the third switch is connected in parallel with the third inductor; and
the fourth switch is connected in parallel with the fourth inductor.

15. The switching mixer of claim 10, wherein
the first inductor, the second inductor, the third inductor, and the fourth inductor are connected in parallel to the input;
the first switch is connected in between the input and the first inductor;
the second switch is connected in between the input and the second inductor;
the third switch is connected in between with the third inductor; and
the fourth switch is connected in between the input and the fourth inductor.

16. The switching mixer of claim 15, further comprising:
a fifth switch coupled to the first switch and configured to turn on based on the switching cycle when the first switch is turned off to maintain the first baseband in the first inductor;
a sixth switch coupled to the second switch and configured to turn on based on the switching cycle when second switch is turn off to maintain the second baseband current in the second inductor;
a seventh switch coupled to the third switch and configured to turn on when based on the switching cycle the third switch is turned off to maintain the third baseband current in the third inductor; and
an eighth switch coupled to the fourth switch and configured to turn on based on the switching cycle when the fourth switch is turned off to maintain the fourth baseband current in the fourth inductor.

17. The switching mixer of claim 10, further comprising:
a gate driver circuit configured to receive a clock signal from a local oscillator and generate the control signal having the switching cycle from the clock signal.

18. The switching mixer of claim 10, further comprising:
a capacitor switching mixer coupled to the input and configured to provide a low-impedance path to ground for RF signals outside a tuned frequency of switching mixer.

* * * * *